US005619161A

United States Patent [19]
Novof et al.

[11] Patent Number: 5,619,161
[45] Date of Patent: Apr. 8, 1997

[54] DIFFRENTIAL CHARGE PUMP WITH INTEGRATED COMMON MODE CONTROL

[75] Inventors: Ilya l. Novof, Essex Junction, Vt.; Donald E. Strayer, Owego, N.Y.

[73] Assignee: International Business Machines Corporation, Armonk, N.Y.

[21] Appl. No.: 611,313

[22] Filed: Mar. 5, 1996

Related U.S. Application Data

[63] Continuation of Ser. No. 298,696, Aug. 31, 1994.

[51] Int. Cl.⁶ .................................................... H03L 7/08
[52] U.S. Cl. .......................... 327/535; 327/536; 327/537; 327/148; 327/157
[58] Field of Search .................................. 327/534, 535, 327/536, 537, 180, 306, 309, 141, 146, 148, 155, 156, 157, 233, 236, 243, 244, 560–563; 331/14, 1, 17

[56] References Cited

U.S. PATENT DOCUMENTS

| | | | |
|---|---|---|---|
| 4,074,205 | 2/1978 | Robe | 330/257 |
| 4,271,434 | 6/1981 | Sakamoto | 358/193.1 |
| 4,276,512 | 6/1981 | Wittke | 327/3 |
| 4,322,643 | 3/1982 | Preslar | 307/528 |
| 4,577,121 | 3/1986 | Sano et al. | 327/65 |
| 4,580,107 | 4/1986 | Caldwell et al. | 331/10 |
| 4,628,461 | 12/1986 | Adams | 364/481 |
| 4,633,193 | 12/1986 | Scordo | 331/1 A |
| 4,668,918 | 5/1987 | Adams | 327/3 |
| 4,748,346 | 5/1988 | Emori | 327/108 |
| 4,754,225 | 6/1988 | Minuhin | 327/3 |
| 4,847,519 | 7/1989 | Wahl et al. | 327/536 |
| 4,875,108 | 10/1989 | Minuhin et al. | 360/51 |
| 4,876,519 | 10/1989 | Davis et al. | 331/57 |
| 4,893,094 | 1/1990 | Herold et al. | 331/1 A |
| 4,942,370 | 7/1990 | Shigemori | 331/1 A |
| 4,959,618 | 9/1990 | Shier | 327/157 |
| 4,982,111 | 1/1991 | Nakaizumi | 327/333 |
| 5,015,970 | 5/1991 | Williams et al. | 331/11 |
| 5,029,282 | 7/1991 | Ito | 327/536 |
| 5,065,115 | 11/1991 | Pletz-Kirsch et al. | 331/14 |
| 5,068,625 | 11/1991 | Baker et al. | 331/1 A |
| 5,072,134 | 12/1991 | Min | 327/536 |
| 5,081,427 | 1/1992 | Suarez | 331/10 |
| 5,095,287 | 3/1992 | Irwin et al. | 331/1 A |
| 5,095,288 | 3/1992 | Dent | 331/17 |
| 5,126,690 | 6/1992 | Bui et al. | 331/1 A |
| 5,128,632 | 7/1992 | Erhart et al. | 331/1 A |
| 5,142,247 | 8/1992 | Lada, Jr. et al. | 331/14 |
| 5,166,641 | 11/1992 | Davis et al. | 331/1 A |
| 5,180,928 | 1/1993 | Choi | 327/536 |
| 5,180,993 | 1/1993 | Dent | 331/16 |
| 5,187,448 | 2/1993 | Brooks et al. | 330/258 |
| 5,206,550 | 4/1993 | Mehta | 327/309 |
| 5,208,546 | 5/1993 | Nagaraj et al. | 328/155 |
| 5,220,294 | 6/1993 | Ichikawa | 331/17 |
| 5,233,314 | 8/1993 | McDermott et al. | 331/17 |
| 5,241,700 | 8/1993 | Geesen et al. | 455/260 |
| 5,257,286 | 10/1993 | Ray | 375/12 |

(List continued on next page.)

Primary Examiner—Timothy P. Callahan
Assistant Examiner—Eunja Shin
Attorney, Agent, or Firm—Calfee, Halter & Griswold

[57] ABSTRACT

A phase locked loop circuit includes a phase/frequency detector which uses a divider circuit and feedback from a clock distribution tree to generate INC and DEC pulses which have no "dead zone". A pair of charge pumps receives the INC and DEC pulses. One charge pump is a differential pump and has voltage controlled common mode feedback circuit to maintain a common mode controlled voltage. A differential current is outputted to a loop filter capacitor by this charge pump. The other charge pump is a single-ended output pump which supplies current to a current controlled oscillator which also receives input from a voltage to current converter. The current controlled oscillator includes a variable resistance load which varies inversely with the magnitude of the input current. A jitter control circuit is provided which reduces jitter in the current controlled oscillator output in the locked phase. Also, a lock indicator is provided which is time independent, and provides a lock indication when the loop enters the locked condition. The circuits for these components are described in detail.

7 Claims, 11 Drawing Sheets

U.S. PATENT DOCUMENTS

| | | | |
|---|---|---|---|
| 5,285,173 | 2/1994 | Reynolds | 332/57 |
| 5,304,952 | 4/1994 | Quiet et al. | 331/1 A |
| 5,304,955 | 4/1994 | Atriss et al. | 331/1 R |
| 5,304,957 | 4/1994 | Edwards | 331/12 |
| 5,315,270 | 5/1994 | Leonowich | 331/1 A |
| 5,319,320 | 6/1994 | Abe et al. | 331/1 A |
| 5,332,978 | 7/1994 | Yabuki et al. | 331/2 |
| 5,334,951 | 8/1994 | Hogeboom | 331/1 A |
| 5,359,299 | 10/1994 | Webster | 327/157 |
| 5,399,995 | 3/1995 | Kardontchik et al. | 331/1 A |
| 5,422,529 | 6/1995 | Lee | 327/536 |

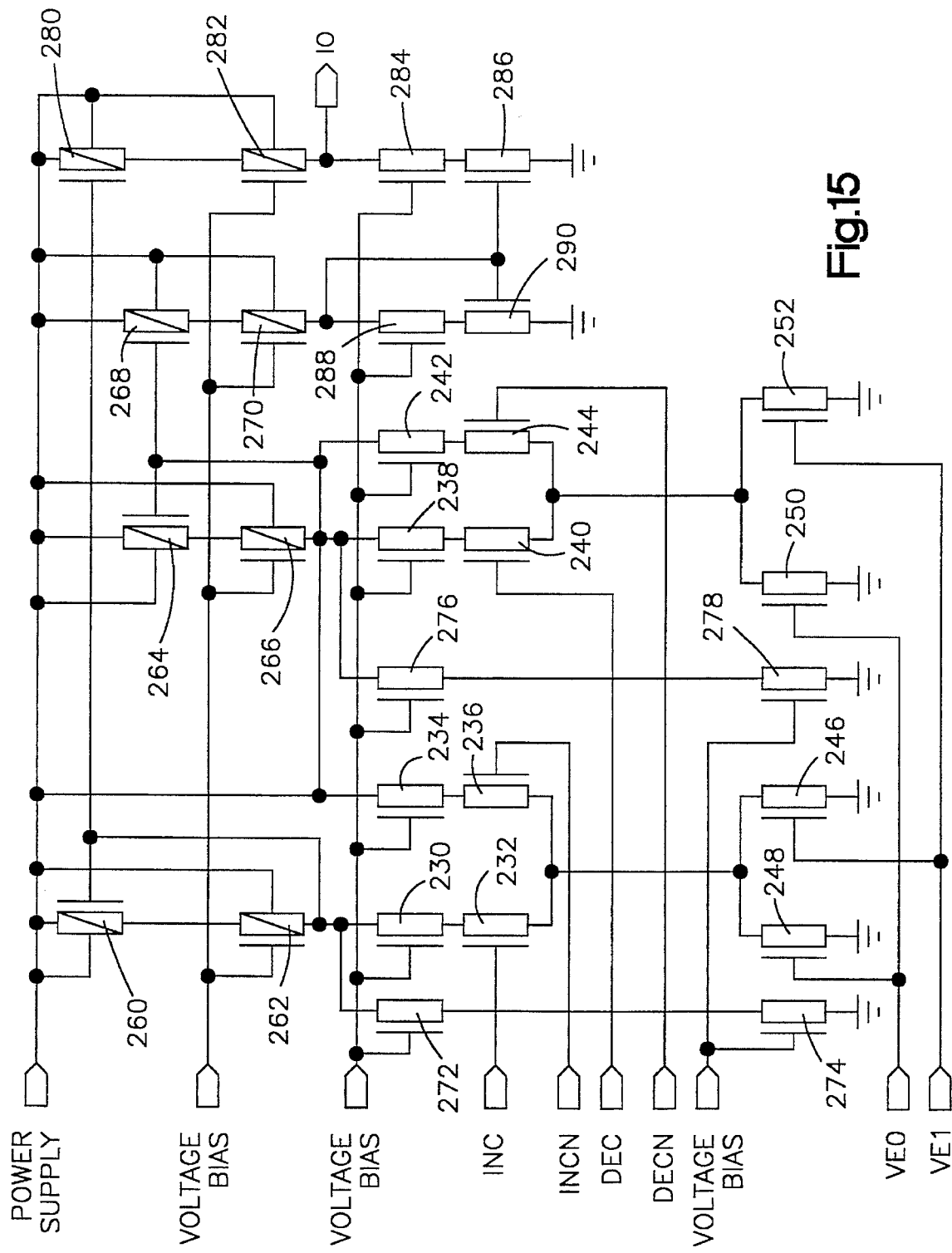

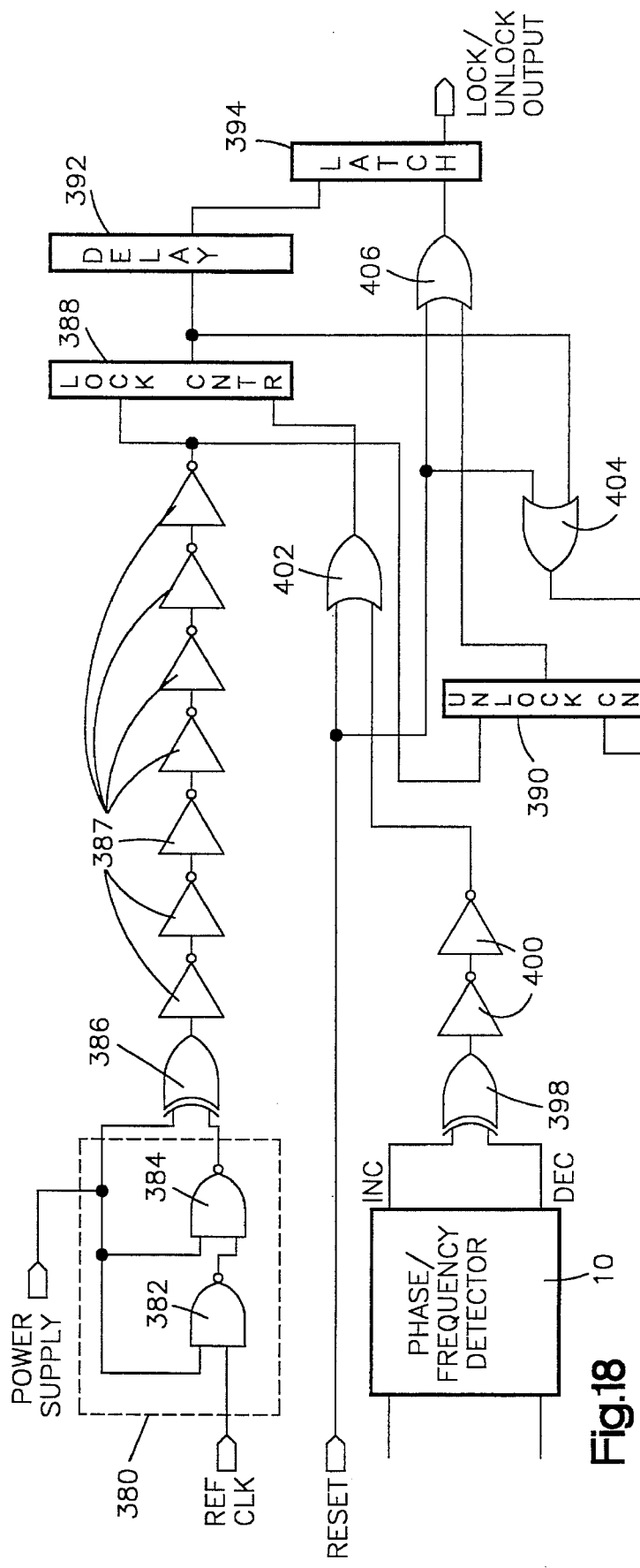
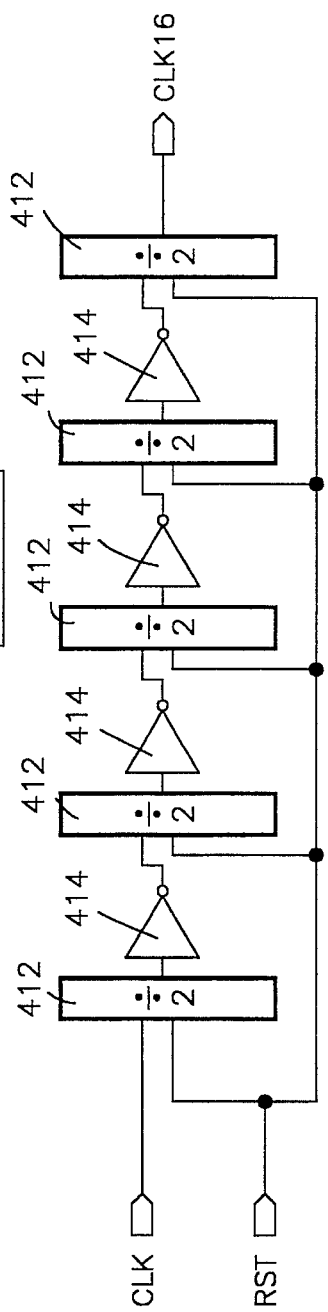
Fig.18
Fig.19

5,619,161

DIFFRENTIAL CHARGE PUMP WITH INTEGRATED COMMON MODE CONTROL

This is a continuation of application Ser. No. 08/298,696 filed on Aug. 31, 1994.

RELATED APPLICATIONS

Patent application Ser. No. 08/298,695, filed Aug. 31, 1994, entitled "Method and Apparatus for Reducing Jitter in a Phase Locked Loop Circuit" (Atty. Docket No. 21323/00155:BU9-94-055);

Patent application Ser. No. 08/298,683, filed Aug. 31, 1994, entitled "Differential Current Controlled Oscillator With Variable Load" (Atty. Docket No. 21323/00157:BU9-94-063);

Patent application Ser. No. 08/298,639, filed Nov. 10, 1994, entitled "Phase Detector With No Phase Error" (Atty. Docket No. 21323/00158: BU9-94-064);

Patent application Ser. No. 08/298,622, filed Aug. 31, 1994, entitled "Lock Indicator For Phase Locked Loop Circuit" (Atty. Docket No. 21323/00160:BU9-94-059); and Patent application Ser. No. 08/298,632, filed Aug. 31, 1994, entitled "Resistorless Phase Locked Loop Circuit Employing Direct Current Injection" (Atty. Docket No. 21323/00161:BU9-94-087).

BACKGROUND OF THE INVENTION

In the design and manufacture of ASIC (Application specific integrated circuit) chips and microprocessor chips it is conventional practice to provide the chip designer with a library of conventional circuits from which to chose and generate his/her design. The chip designer chooses from this library the necessary circuits and connects them to form the desired chip configuration. In the case of microprocessors the designs and parameters of the library circuits are fixed thus imposing certain constraints on the chip designer. In the case of ASIC chips not only are the designs fixed but also the rules of wiring are fixed thus imposing additional constraints. Thus the designer is constrained by the circuit design and in the case of ASIC chips the rules in using the various circuits.

One of the library circuits which can be used by a chip designer is a phase locked loop circuit. Phase locked loops (PLLs) are widely used in many different applications. They are used to perform two or three different functions. A principal function is to lock or align the output clock of a circuit with the clock input. Another function is to multiply (i.e. increase) or divide (i.e. decrease) the output frequency of a circuit with respect to the input frequency. Another function of a phase locked loop is to provide clock recovery, i.e. to attenuate the input jitter associated with input signals and recover clock from jittery input data.

In providing a phase locked loop circuit, as with other circuits, it is desirable to provide a circuit that is versatile, i.e. one that can be used in a wide variety of applications and environments. Specifically, one challenge is to provide a phase locked loop, which is an analog circuit, which can be used in digital CMOS technology in which a good deal of substrate noise is generated. It is also desirable to provide a PLL that is operational over a broad frequency range. Moreover it is necessary in the design of ASIC chips to compensate for delays induced in clock distribution trees as well as any delays that might be induced by dividers in the feedback portion of the circuit when frequency is being multiplied, which often occurs when the signal is being received from a relatively low frequency source, such as a card, and is being multiplied for use on a chip.

It is also desirable to reduce jitter in both the high frequency range as well as in the lower frequency ranges. To further complicate matters, a recent design problem that has emerged is that associated with reduced power supply voltages at which the chips operate, these being as low as 5, or 3, or even as low as 2 volts. At these low power supply voltages conventional charge pumps in many cases are not adequate to maintain the loop in locked condition. Moreover, overriding all of these constraints and conditions is the need to use as little "real estate" i.e. surface area of the chip as possible for the circuit, which has been and continues to be a major consideration in the design of PLLs as well as other circuits.

Hence it is a object of the present invention to provide a PLL suitable for use in microprocessor chips as well as ASIC chips that is versatile, has essentially zero feed-back delay,is quite insensitive to substrate and power supply noise, is conservative of real estate, and can operate over a wide range of frequencies.

SUMMARY OF THE INVENTION

According to the present invention, a differential charge pump having common mode voltage control is provided. The charge pump is used in a phase locked loop circuit. The common mode control maintains the output terminal of the pump at a common mode voltage having a given relationship with respect to the voltage of power supply. Preferably, this voltage is about one-half the power supply voltage. This extends the operating range of the charge pump.

BRIEF DESCRIPTION OF THE DRAWINGS

FIG. 15 is a circuit diagram of the single ended output charge pump of the PLL circuit;

FIG. 18 is a circuit diagram of the lock indicator of the PLL circuit; and

FIG. 19 is a diagram showing one of the divider circuits used in the lock indicator of FIG. 17.

DESCRIPTION OF THE PREFERRED EMBODIMENT(S)

Phase Locked Loop Circuit

Figure 1:
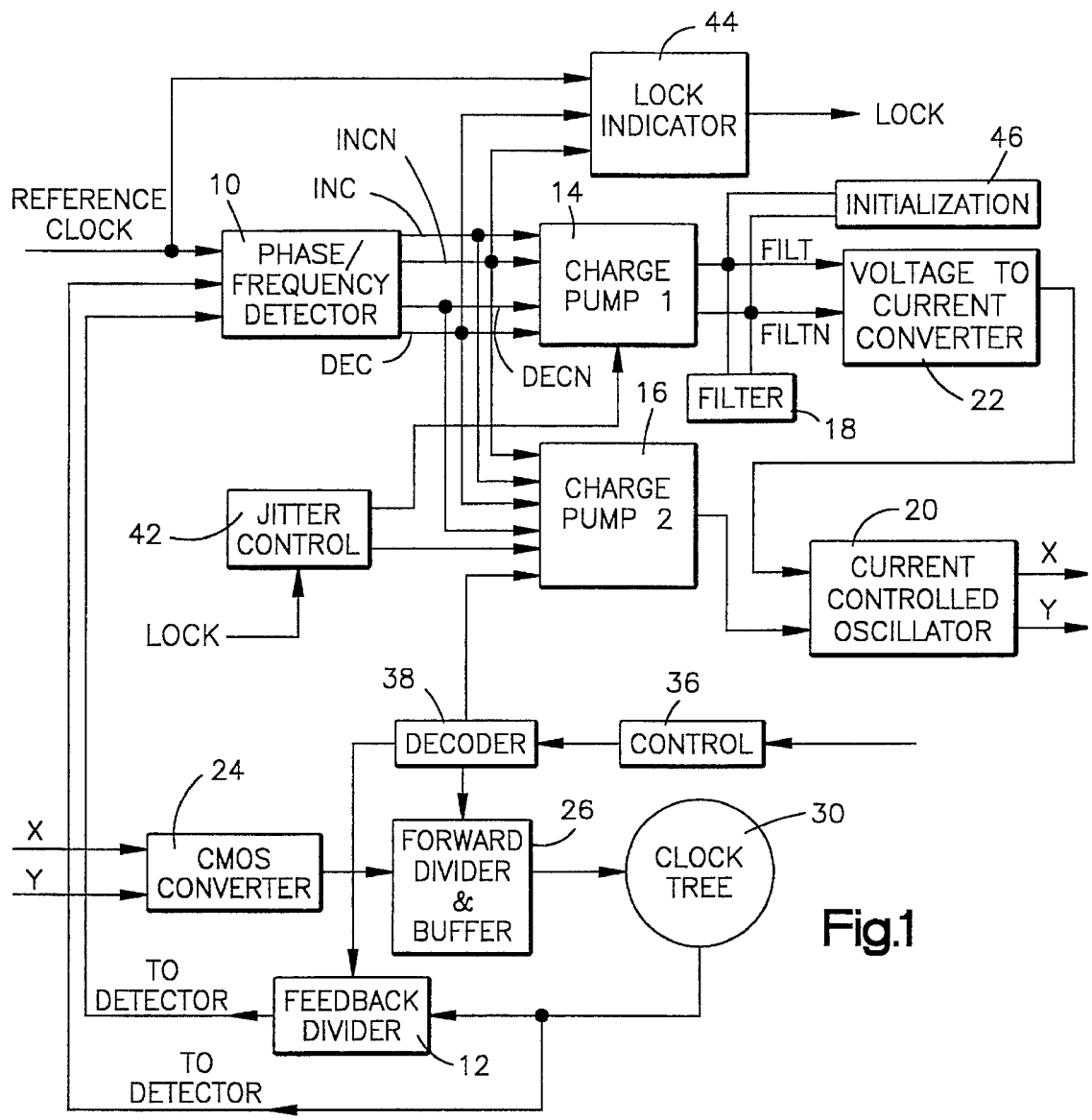
FIG. 1 is a high level block diagram of the improved phase locked loop circuit.

Referring now to the drawings, and for the present to FIG. 1, a block diagram of a phase locked loop (PLL) circuit according to this invention is shown. Various of components and subcircuits of the components will be described in detail presently.

The circuit includes a phase/frequency detector 10 which receives a reference clock input and compares the reference clock input frequency with an output clock signal. The phase/frequency detector 10 also receives as input an output strobe pulse of a feedback divider/pulse generator 12 which provides for frequency multiplication in a well-known manner. The strobe pulse is used within the phase/frequency detector 10 to mask the output clock (in a manner to be described) to accomplish frequency division without delay associated with the feed back divider 12 since the phase/frequency detector is comparing a masked feedback signal directly from the clock output and not from the feedback divider/pulse generator 12. Generally, the feedback from the clock is used to align the frequency and the feedback from the feedback divider is used to align the frequency, as will be described presently. The phase/frequency detector 10 will output increment (INC) and decrement (DEC) pulses to charge pumps 14 and 16.

Figure 5:
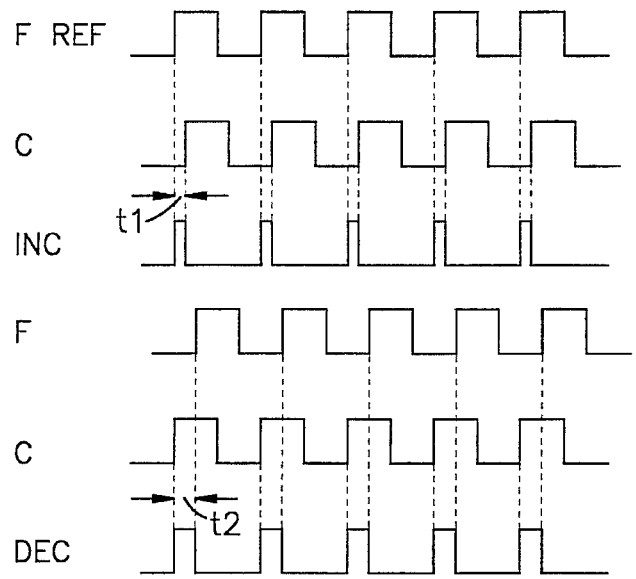
FIG. 5 is a graphical representation of INC and DEC pulses outputted from a conventional phase/frequency detector with a "dead zone"

The phase/frequency detector 10 is a rising edge detector. It compares the rising edge of the clock reference signal and rising edge of PLL output clock. FIG. 5 (which will be described in more detail later) shows the creation of the INC and DEC outputs of typical prior art phase/frequency detectors with a "dead zone". When output clock phase falls behind or lags the reference clock phase, increment (INC) pulses are generated. The width of this pulse t1 is equal to the timing difference between the rising edges of the reference clock and output clock. When output clock phase is ahead of or leads the reference clock phase decrement (DEC) pulses are generated. The width of this DEC t2 pulse equals the timing difference between the rising edges of the output clock and reference clocks. Due to the speed limitations of the phase/frequency detector circuits, no INC or DEC signals will be generated when reference clock and output clock phases reach a certain stated value Δ. If this value Δ is around zero, the detector phase crossing is known as "dead zone" because the detector is functionally "dead" in this region.

Figure 6:
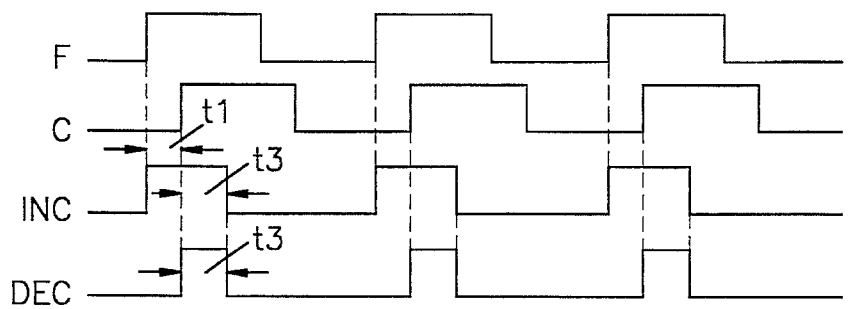
FIG. 6 is a graphical representation of the INC and DEC pulses outputted by the phase/frequency detector of this PLL without a "dead zone"

This will cause PLL extra static phase error. In order to build a phase/frequency detector without the "dead zone", extra delay is added in the detector state machine. The structure of which will be described in conjunction with FIG. 3 later. FIG. 6 shows the timing diagram of phase/frequency detector 10 without a "dead zone" as in this circuit. When output clock falls behind (lags) the reference clock in phase, the INC pulse is generated. The width of this INC pulse consists of two portions, t1 and t3. t1 is equal to the timing difference of rising edges of reference clock and output clock. t3 is produced by the extra delay in the phase detector state machine. DEC pulses are created too, and their width is equal to t3. As will be described presently, charge pumps will generate current pulses equal in width to INC and DEC pulses. Because INC will add charge to filter 18 and DEC will subtract charge from the filter 18, t3 portion of INC and DEC charges will cancel each other at the loop filter 18. The net charge to the filter will be proportional to t1 only.

Charge pump 14 outputs a current signal to differential loop filter 18, which is comprised of a pair of capacitors, and which pump 14 will either increase or decrease the charge on the loop filter capacitors 18 depending upon whether the signal is to increment or decrement the frequency. The increment/decrement signal is also supplied to the second charge pump 16 which converts the increment/decrement signal to a current output which is fed forward to a differential current controlled oscillator 20 which changes its output frequency in response to change in input current. The use of charge pump 16 which supplies current to the oscillator 20 eliminates the need for a resistor coupled to the capacitor of the filter 18. In effect, this performs the differentiation function normally accomplished by such a resistor, as will be described presently in conjunction with the current controlled oscillator 20. A more detailed description of the circuitry of the phase/frequency detector 10 and the charge pumps 14, 16 and the current controlled oscillator 20 will be described presently. Thus, if the output clock is earlier in phase than the reference clock, the phase/frequency detector 10 generates a decrement pulse, and the charge pumps 14, 16 convert this logic signal to current pulses. The pulse from charge pump 14 decreases the voltage across loop filter capacitors 18. Conversely, if the output clock signal is later in phase than the reference clock, the phase/frequency detector 10 generates an increment pulse that the charge pump 14 uses to increase the voltage across the loop filter capacitor 18. The loop filter capacitor 18 converts the current from the first charge pump 14 to voltage. In essence, the loop filter capacitor 18 and the charge pump 16 smooth the pulses from pulse generator in order to provide smooth DC voltage to voltage to current converter 22.

Figure 13A:
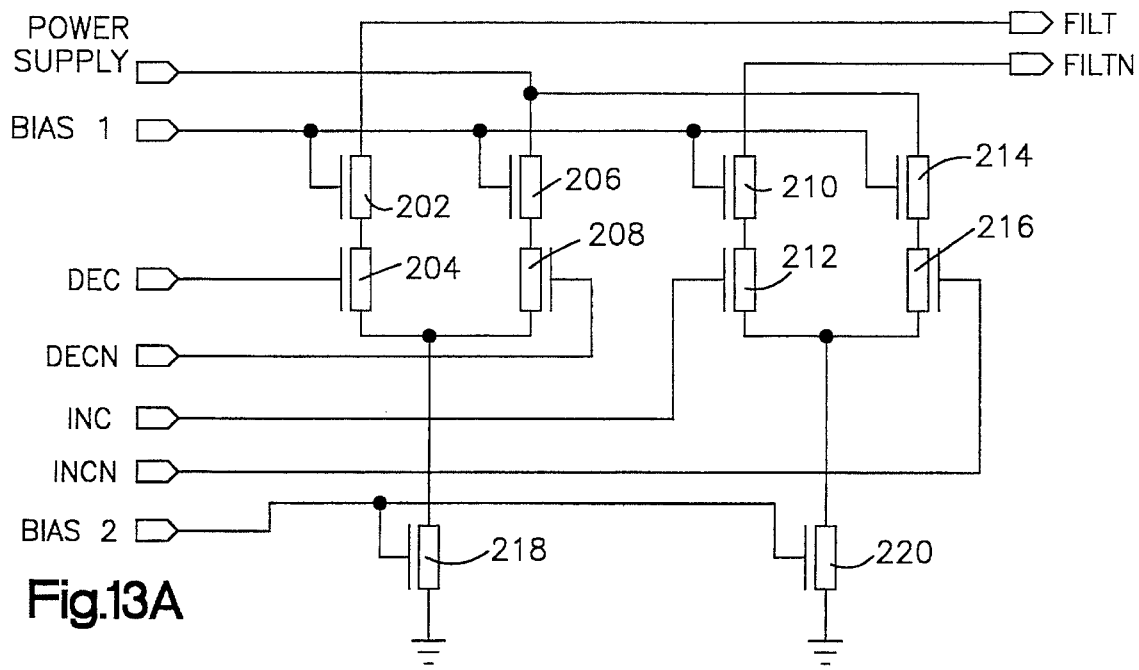
FIG. 13A is a circuit diagram of the main switch of the differential charge pumps of the PLL circuit.
Figure 13:
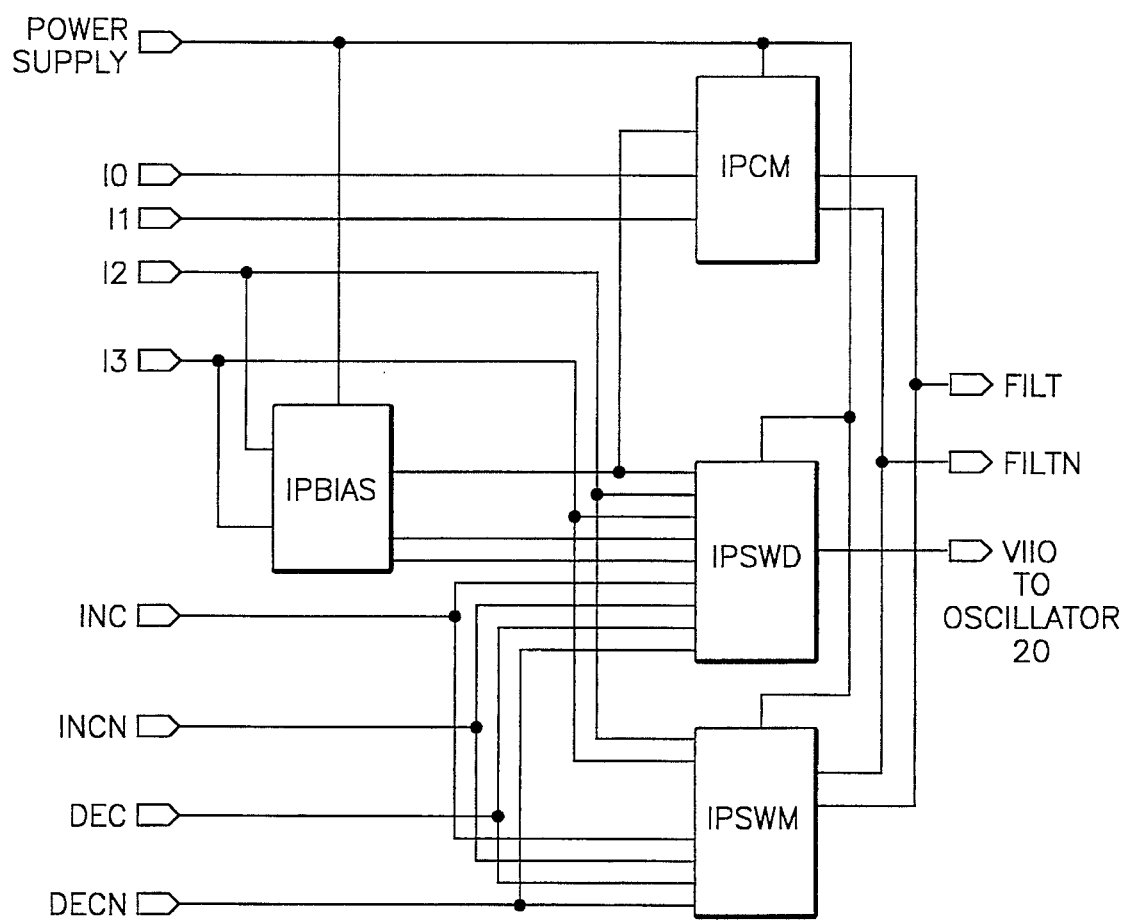
FIG. 13 is a high level diagram of the charge pump configuration.

The zero needed for loop stability is created by the charge pump 16 which injects current directly into the oscillator 20 (as shown in FIG. 13 and will be presently described in more detail) after the required gain is applied to the output of the phase/frequency detector 10.

The action of the charge pump in creating the zero can best be explained by examining the prior art wherein the filter is comprised of a resistor R in series with a capacitor C. The filter is fed by a charge pump which puts out current pulses $i(\omega)$, where $\omega$ is equal to $2\pi f$, and where f is the frequency. The voltage across the filter $v(\omega)$ is then fed into the voltage-to-current converter which has a gain of g. The output of the voltage-to-current converter $i_1$ is fed into the current controlled oscillator.

v(ω) is defined by the equation:

$$v(\omega) = i(\omega) \times R + \frac{i(\omega)}{(\omega)c} \quad (1)$$

and $i_1$ is defined by the equation:

$$i_1 = g \times v(\omega) = g \times R \times i(\omega) + g \times \frac{i(\omega)}{(\omega)c} \quad (2)$$

It can be seen then that the first term in the above equation, i.e., g×R×i(ω)=$i_d$ is really the current i(ω) multiplied by a gain factor g×R, while the second term represents the integral of the injected charge. The current fed into the oscillator is thus the sum of two components.

In the present implementation, the total injected current is created by summing the two terms in the above equation. Charge pump 16 creates the first term $i_d$ by applying the correct gain to the current, while charge pump 14 implements the capacitive integration through the filter and the voltage-to-current converter. The two components of the total current are then summed at the current controlled oscillator input. The key benefits of this resistorless implementation are that no resistor is needed in the loop filter, thus saving space and cost; and also, it is easy to change the gain g×R to accommodate a wide range of input and output clock operating frequencies.

The output voltage from the loop filter capacitor 18 is supplied as input to the voltage to current converter 22 of conventional design wherein the voltage is converted to current as an output in a well-known manner. The output current from the voltage to current converter 22 is supplied to the differential current controlled oscillator 20 along with the output from the charge pump 16. These two inputs are summed by the current controlled oscillator 20 to provide a differential output, the frequency of which depends upon the value of the current outputs of voltage to current converter 22 and the second charge pump 16.

The differential voltage output of the differential current controlled oscillator 20 is supplied to CMOS converter 24 of conventional design which converts the differential voltage output of this oscillator 20 to a single ended output of the desired frequency. The output of the CMOS converter 24 is supplied to a forward frequency divider and buffer 26, of conventional design, which provides a signal having the desired multiple of the input clock frequency as input to a clock distribution tree 30.

The clock distribution tree 30 is a series of clock circuits designed and utilized by the chip designer to perform various clocking functions that are required. In the case of ASIC chips there may be several chips used each of which requires the same clock timing signals. Since processing variables may tend to introduce different delays from chip to chip in the clock distribution tree, the output from the clock distribution tree rather than the output from forward divider and buffer 26 is used as the input to the phase/frequency detector 10 so as to provide the proper phase alignment in all of the chips running from the same clock irrespective of different delays in different chips. The output from the clock distribution tree is also used as input to feedback divider and buffer 12, of conventional design, which functions as a frequency multiplier for the output from the phase/frequency detector 10.

In order to control the frequency multiplication ratio as well as control the gain of the charge pump 16 a control circuit 36 is provided which provides signals to a decoder 38. The decoder 38 in a well known manner provides signals to charge pump 16 and dividers 26, and 12 to set the frequency multiplication ratios of the circuit.

A jitter control circuit 42 is also provided, which will be described in detail presently, and which receives as input the output signal from the phase/frequency detector 10 and controls outputs to the charge pumps 14, 16 to reduce jitter in a manner which will be described presently. As shown in FIG. 1, the jitter control circuit 42 is connected to the phase/frequency detector 10. However, it can be connected to and actuated by a lock indicator 44 as will be described presently. The lock indicator 44 receives input from the phase/frequency detector 10 and the clock reference signal and outputs a "locked" signal. Finally an initialization circuit 46 is provided which will initialize the circuit in a stable range for proper phase locking by supplying a proper charge to the loop filter capacitor 18 in a well-known manner.

Electrical inputs are provided to the various circuits, which are well known in the art and not shown in FIG. 1. Certain of these will be referred to in describing the circuits of various components.

Initialization

Figure 2:
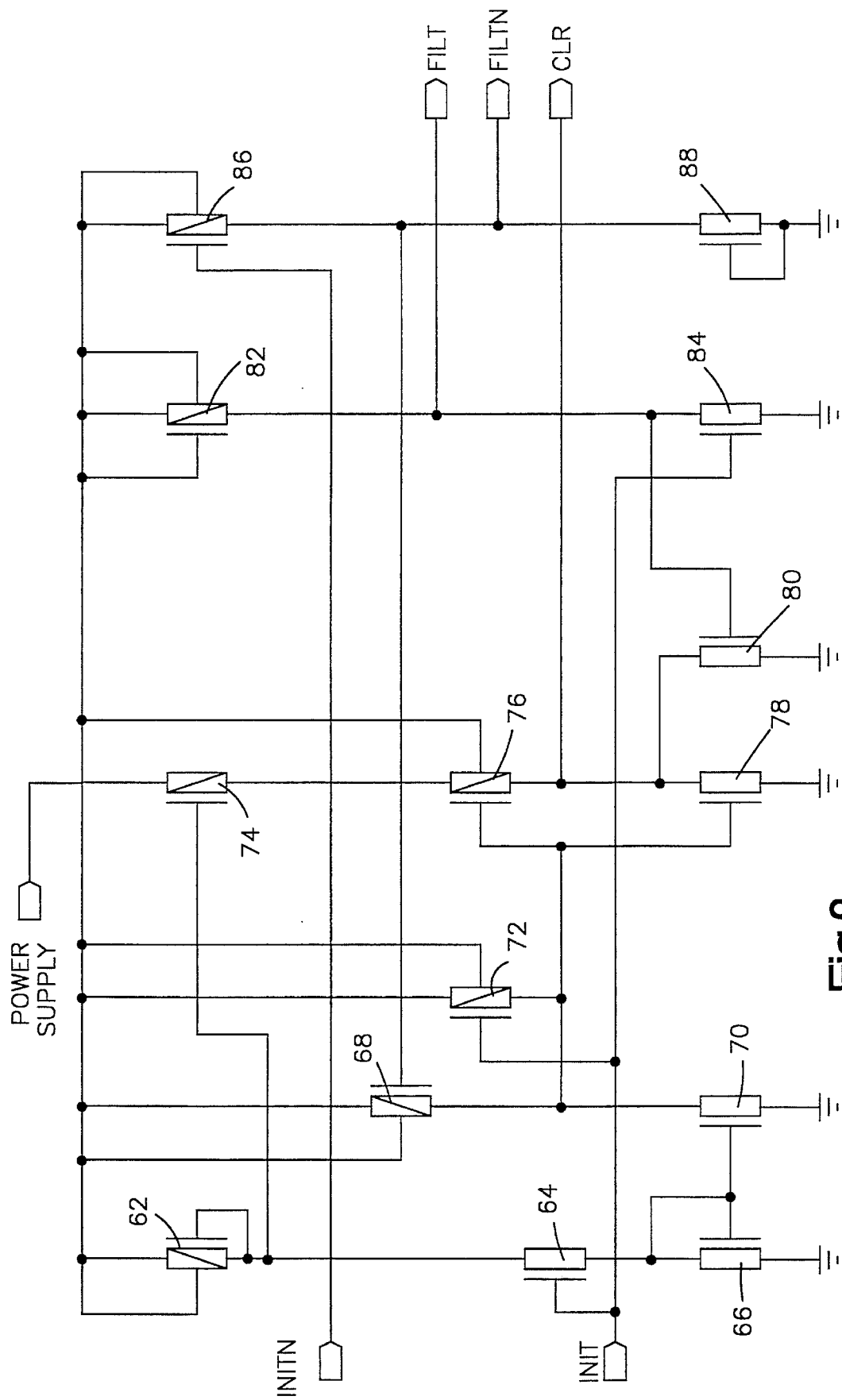
FIG. 2 is a circuit diagram of the initialization circuit.

Referring now to FIG. 2, at power up, inputs INIT and INITN are forced high and low, respectively, by a latch that is set when power is applied. These turn on FET devices 84 and 86 to pull FILTN high and FILT low, forcing the ICO to its lowest operating frequency. INIT high also activates FETs 62-80, which sense the FILT/FILTN voltages and hold CLR low until FILT is near ground and FILTN is near power supply voltage. CLR then rises, resetting the latch in INITA and turning off the initialization devices. FETs 82 and 88 are permanently off, but match the capacitance added to FILT and FILTN by FETs 84 and 86. Such initialization circuits are well known in the art.

Phase/Frequency Detector and Divider

The phase/frequency detector 10 is configured to receive output signal from the clock tree 30 and also from the feedback divider 12 and using these signals detect the phase difference with respect to the reference clock, and output the necessary increment and decrement signals. Both signals (clock tree 30 output and feedback divider 12 output) are used since the output frequency is a multiple of the input frequency, and the feedback divider, while outputting a signal matching the frequency of the input signal introduces a delay; hence, the phase of the output of the feedback divider 12 lags the phase of the output signal from the clock tree 30. The phase/frequency detector 10 includes circuitry, which will be described presently, which masks the output signals from the clock tree so as to have unmasked rising or falling edges of this pulse match the frequency of the rising or falling edges of reference clock input. The waveform illustrating this function is shown in FIG. 3.

Figure 3:
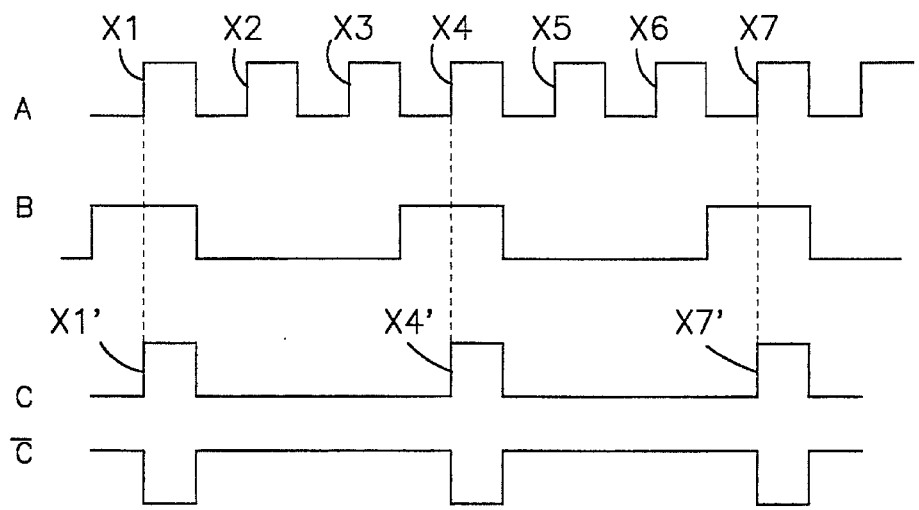
FIG. 3 is a graphical representation of the masking function of the feedback frequency divider with respect to the feedback signal from the clock distribution tree.

As can be seen in FIG. 3 pulse signal A represents the output signal from the clock tree 30 whose frequency is a given multiple of the frequency of the reference clock. In this illustrated example this is three times the frequency of reference clock frequency. The feedback divider 12 in a well known manner outputs the pulse signal shown as B. Essentially each of the pulses of signal B extend for three pulses of Signal A. Also, Signal B is lagging the Signal A which is a result of the delay induced by the feedback divider 12. In the present embodiment, the rising edge of the Signal A is used for phase alignment. The result of masking of Signal A is shown as Signal C. Signal B is used to mask Signal A in the following way. When Signal B is high, it does not mask the Signal A, so the rising edge X1 of Signal A is the resultant output as rising edge X1' of signal C. However, when Signal B is low, it masks Signal A so that the rising edges of Signal A, and thus rising edges X2 and X3, are masked and do not appear as outputs. When Signal B again goes high, it does not mask rising edge X4 of signal A and this appears on output Signal C as output X4'. Rising edges X5 and X6 of Signal A are masked, and rising edge X7 is not masked and appears as X7' on Signal C. Thus, output Signal C has pulses at one third the frequency of Signal A which is the feedback signal from the clock tree 30. These pulses are matched to the frequency of the reference clock without the induced delay of signal B from the feedback divider 12. The signal C is inverted to form signal $\overline{C}$, which is used as a falling edge input to the core state machine of a phase/detector; the core state machine is a falling edge detector. The circuitry for the phase/frequency detector 10, which includes generating Signal C from Signals A and B is shown in FIG. 4.

Figure 4:
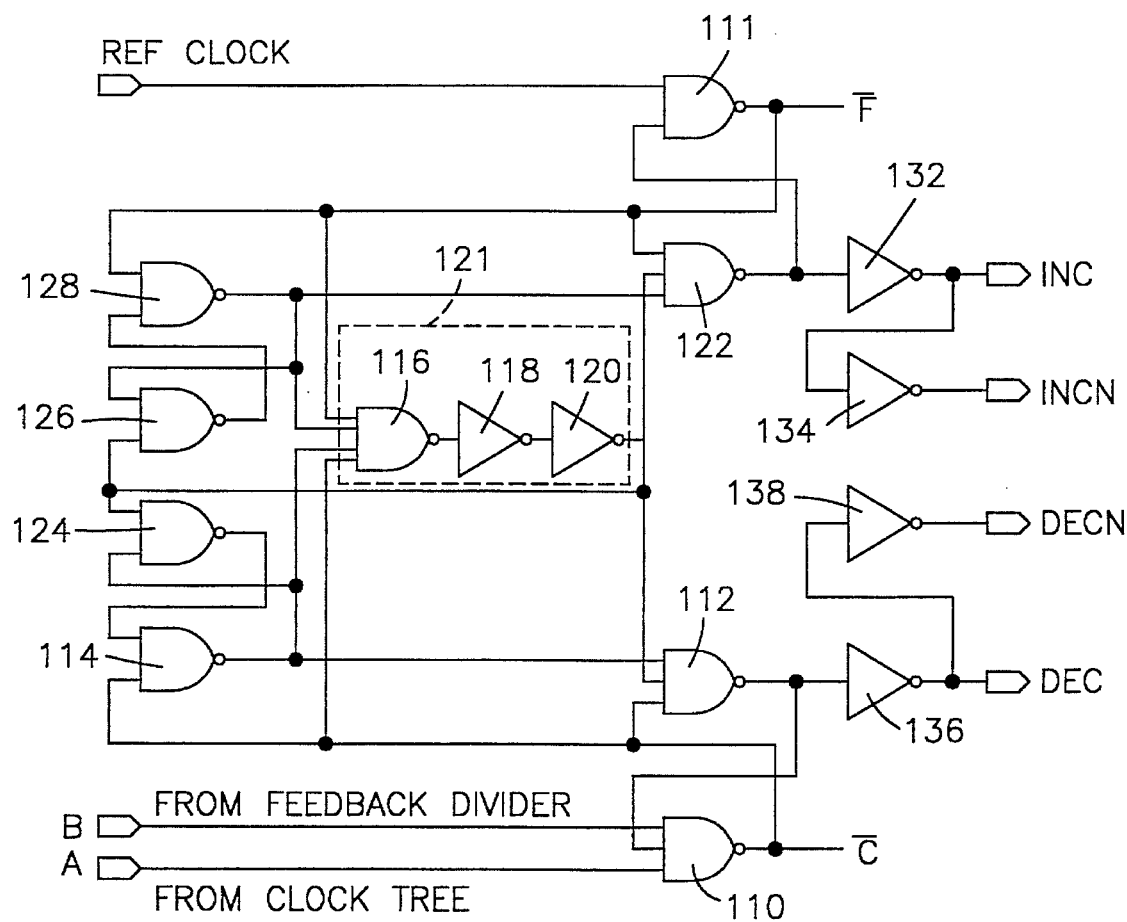
FIG. 4 is a circuit diagram of the circuitry of the phase/frequency detector.

Referring now to FIG. 4, the two input signals A and B are inputted to NAND gate 110, and the gate 110 outputs Signal $\overline{C}$. The reference clock signal, denoted as $\overline{F}$, is inputted to NND gate 111. The output of gate 110 is the signal whose phase is to be compared with the phase of the signal from gate 111. The remainder of the circuitry performs this phase comparison in a manner which is generally well known. The output from the gate 110 is supplied as one input to NAND gate 112 and also as one input to NAND gate 114. The output from gate 114 is inputted to NAND gate 116 which outputs a signal to inverters 118 and 120. Gate 116 and inverters 118 and 120 act as a delay circuit 121 the function and purpose of which will be described presently. The output from inverter 120 is inputted to NAND gate 122 as well as to gate 112, and also to NAND gates 124 and 126. The output from gate 114 is also one input to gate 124 the output of which is one input to gate 114. The output from gate 126 is one input to NAND gate 128 the other input of which is from gate 111.

The output of gate 122 is inputted into inverter 132 which generates an increment (INC) signal and the output of the inverter 132 is inputted to inverter 134 which generates an inverted increment signal referred to as the increment not signal (INCN). Similarly the output of gate 112 is inputted into inverter 136 which outputs a decrement signal (DEC) and the output of inverter 136 is also inputted into inverter 138 which inverts the decrement signal to produce a signal referred to the decrement not (DECN) signal. It is the INC and DEC signals that are read to actuate the charge pumps 14 and 16. Since the charge pumps are differential the "NOT" signals are also necessary as is well known for differential circuits. It is the duration of the INC or DEC pulses that control the time the charge pumps 14, 16 output current.

As indicated earlier the phase/frequency detector 10 includes delay circuit 121. The purpose of this circuit is to introduce a delay of fixed value, depending upon the delay value of the inverters 118 and 120. This is to eliminate the so called "dead zone", which is a condition wherein the pulse width of the INC or DEC pulses is such that detectors cannot react to the signal phase differences due to circuit speed limitation. The delay introduces a given fixed pulse width component to every increment pulse and every decrement pulse. This is demonstrated in FIGS. 5 and 6. FIG. 5 is a diagram of a conventional signal output without delay introduced, and FIG. 6 is a diagram of the signal output with the delay according to the invention.

To review the explanation of FIGS. 4 and 5 above, in FIG. 5, the input reference signal is shown as Signal F, and the output signal from the phase/frequency detector 10 is shown as Signal C. As can be seen in FIG. 5, when the pulse Signal C is leading the reference pulse signal F by an amount t1 an increment (INC) pulse is generated, the width of which corresponds to the time that Signal C leads Signal F. When Signal F lags Signal C, a decrement (DEC) pulse is generated, the width of t2 which corresponds to the time that Signal F lags Signal C. When the width of these DEC or INC pulses is small, this corresponds to the dead zone where the system is not fast enough to respond.

The pulse signals generated by this circuit with the delay are shown in FIG. 6. When the pulse C lags pulse F, an increment (INC) pulse of a width of t1+t3 is generated wherein t3 corresponds to the delay induced by delay circuit 121, and t1 corresponds to the amount of lag. A decrement (DEC) pulse of a width equal to t3 is also generated. Hence when these two pulses INC and DEC are supplied to the charge pumps 14 and 16 the t3 components of each of the signals cancel each other and the result is an increment of charge proportional to t1 being supplied from the charge pumps 14 and 16 to the capacitor 18 and oscillator 20 respectively. This is accomplished, however, by generation of INC and DEC pulses of width that the system can handle, but each of which have components that cancel each other. Similarly, if pulse F lags pulse C, a decrement (DEC) pulse of a width t2 and t3 is generated and an increment (INC) pulse of width t3 is generated. The t3 values of each cancel out when supplied to the charge pumps 14 and 16. Thus, even small INC or DEC pulses are effectively created without a dead zone.

Figure 7:
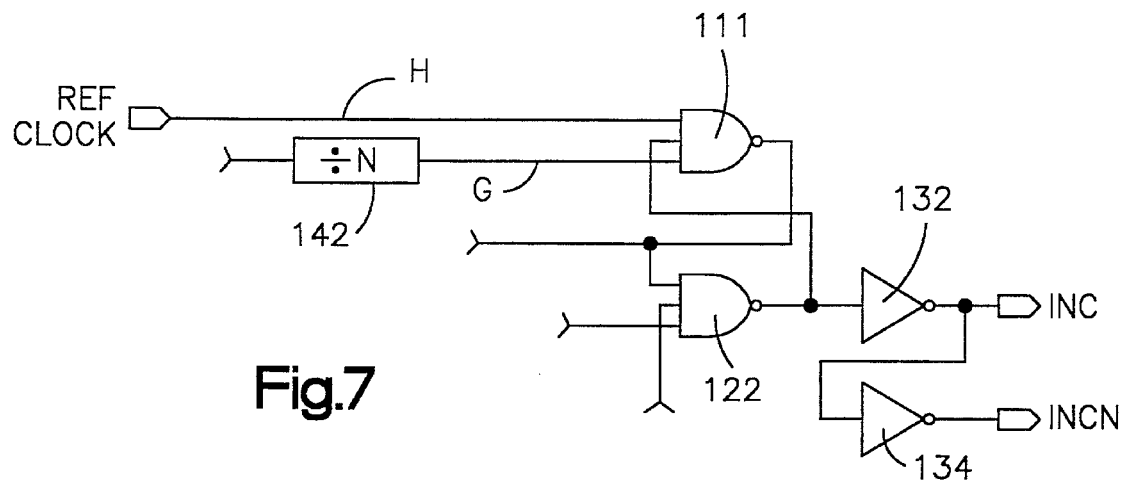
FIG. 7 is a portion of the circuit similar to FIG. 5 in which a divided input is utilized.

Also, if a divider is used to supply an input signal to the phase/frequency detector 10, a dual input to NAND gate 111 similar to the input to gate 110 can be utilized to eliminate a delay caused by the divider to the input using the individual original signal as input as well as the divide signal. This is shown in FIG. 7 which shows an input divider 142 supplying a Signal G as well as a reference clock input H AND gate 111. The output of gate 111 will then be similar to that of gate 110.

Jitter Control

Figure 8:
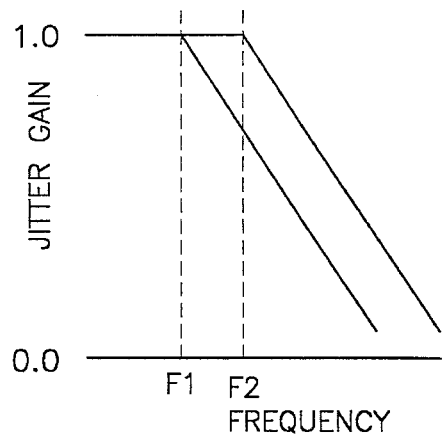
FIG. 8 is a graphical representation of the variation of jitter gain with respect to frequency without the jitter control circuit.

One of the characteristics of the environment in which the phase lock loop operates is known as jitter which is a result of slight inherent variations in the frequency of the input clock pulses. This results in a noise condition which if not corrected or compensated for shows up on the output signal from the current controlled oscillator 20, especially in the lower frequency ranges. FIG. 8 shows a plot of a typical PLL noise gain (output noise divided by input noise) as a function of noise frequency. At low frequencies this gain is unity, and thus all input jitter is fed through the PLL as output noise. The frequency at which the gain starts declining can be adjusted somewhat, e.g., between F1 and F2 by controlling values of various components, but even so the low frequencies will still be throughput as unity. The jitter control circuit 42 reduces the output jitter or noise, even at low frequencies, when the PLL is in the locked or operating condition.

The jitter control circuit operates on the principle that during the locking phase of the PLL, i.e. when the circuit is not locked but is generating incrementing and decrementing pulses, a relatively large current is supplied from the reference current generator in order to allow the PLL to become locked; but when the PLL is in the locked condition a much smaller average current is supplied in order to maintain the PLL in the locked condition. The amount of jitter on the output depends upon the output current of the charge pumps 14, 16, and a reduction in current supplied to the charge pumps will result in a reduction of the charge pump output, which in turn reduces the output noise due to jitter.

Figure 9:
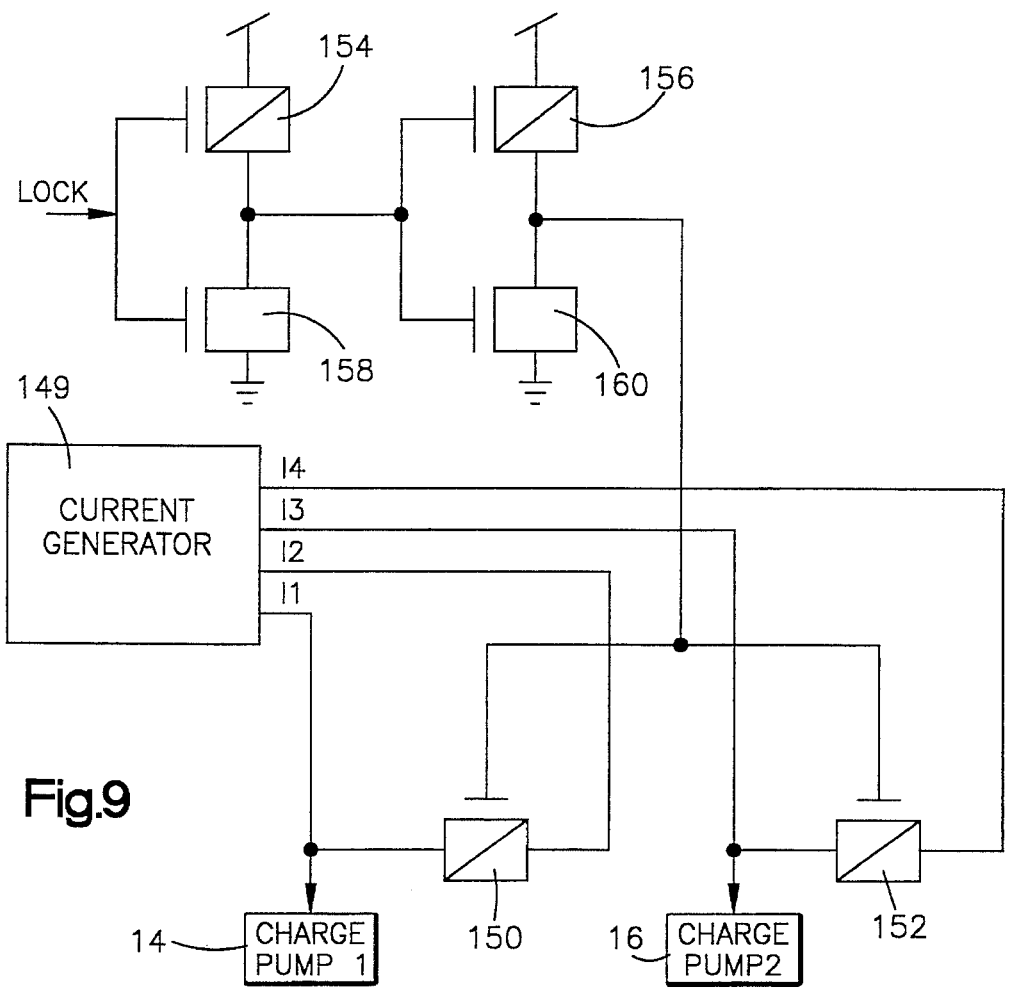
FIG. 9 is a circuit diagram of the jitter control circuit of the PLL.

The circuit for controlling the current to the charge pumps is shown in FIG. 9. This circuit utilizes four current inputs from current generator 149 designated as I1, I2, I3, and I4. Current I1 is supplied directly to charge pump 14 and current I3 is supplied directly to charge pump 16. Current I2 is supplied through Field Effect Transistor (FET) 150 to charge pump 14, and current I4 is supplied through FET 152 to charge pump 16. Thus if FETs 150 and 152 are turned on the total current supplied to charge pump 14 will be I1 plus I2 and the total current supplied to charge pump 16 will be I3 plus I4. Conversely, if FETs 150, and 152 are turned off the current supplied to charge pump 14 will be I1 and the current supplied to charge pump 16 will be I3. Hence during the locking phase of the PLL when it is adjusting the frequency to arrive at the locked condition the FETs 150, and 152 are turned on, but when the PLL reaches the locked or operating condition the FETs 150, and 152 are turned off thus reducing the current supplied to the charge pumps 14, and 16. This reduced current results in a reduction of the noise in the output signal.

Figure 10:
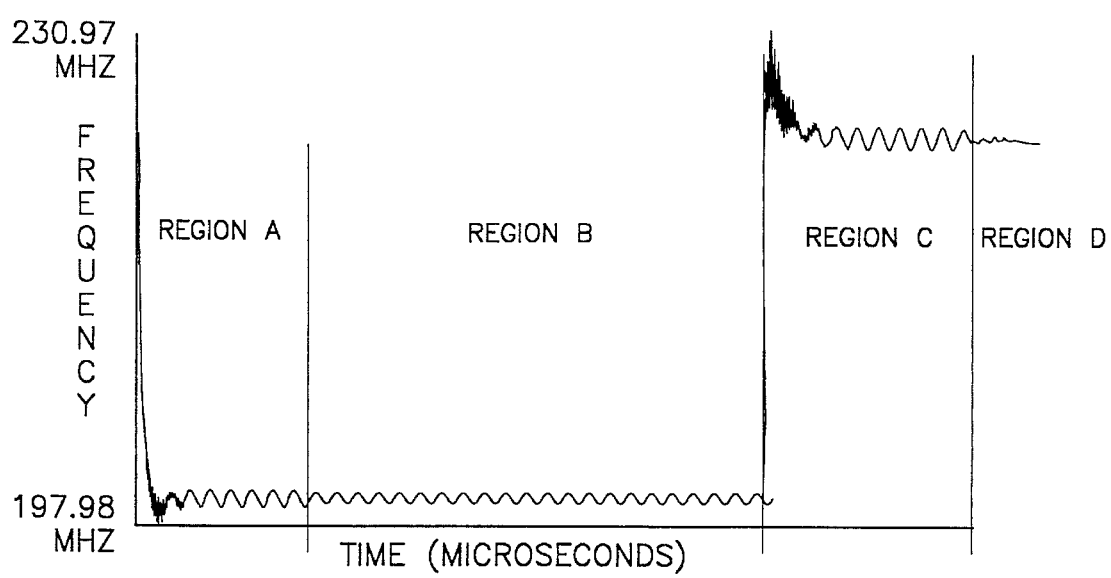
FIG. 10 is a graphical representation of the reduction in output noise when the jitter control of this invention is employed.

This reduction in noise is shown in FIG. 10. The left hand side of the plot designated as region A shows the noise frequency variation on the output signal as it goes from the locking condition to the locked condition at a given clock input frequency. (The input includes a fixed frequency jitter.) In this region A all four currents I1, I2, I3, and I4 are applied to the charge pumps 14, and 16.

Figure 11:
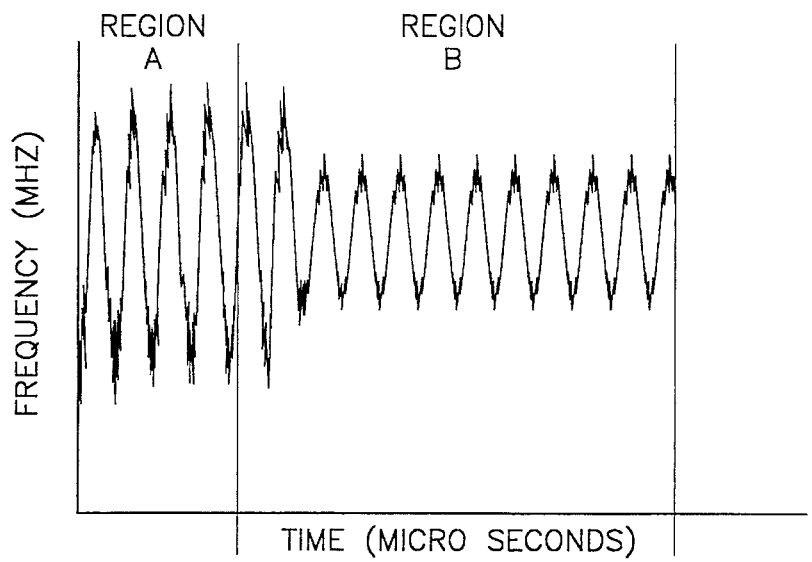
FIG. 11 is an enlarged showing of a portion of the graph of FIG. 10.

The next region, designated as region B shows the noise on the output signal when the PLL has reached the locked condition at the same given frequency and input jitter. In this region B only currents I1 and I3 are supplied to the charge pumps 14, and 16. FIG. 11 shows on an enlarged scale portions of region A and region B, showing the dramatic decrease in noise in the output signal.

Still referring to FIG. 10, the next region, region C shows the noise in the output signal when the frequency of the reference clock is changed thus changing the output frequency. During this change the PLL entered the locking mode and thus all four currents I1, I2, I3, and I4 were applied to the charge pumps 14, and 16 and thus there is high noise level.

Once the PLL moves into the locked condition for this new frequency as shown in region D the current from I2 and I4 is removed by turning off the FETs 150 and 152 leaving only the current from I1 and I3 thus reducing the noise in the output signal at this new input frequency.

Figure 12:
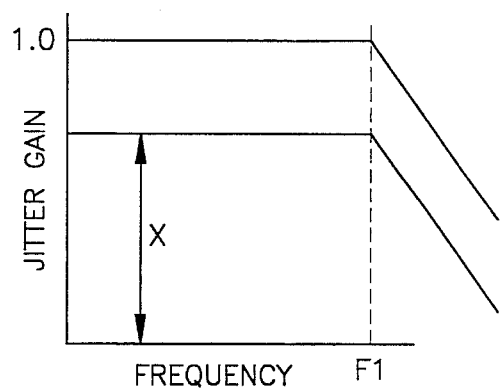
FIG. 12 is a graphical representation of the PLL jitter gain as a function of frequency when using the jitter control device and methods of this invention.

The jitter gain reduction shown in FIG. 12 will depend on the reduction of the charge pump output; thus a greater reduction in current to the charge pump will lead to less output noise. However, it is not desirable to reduce the charge pump output to very small values due to stability concerns; the degree of reduction is thus a system design parameter. A reduction to a value of X of about 0.6 is readily obtained, and by optimizing circuit parameters, a reduction in the value of X to about 0.25 can be achieved.

As illustrated in FIG. 9, the FETs 150 and 152 are turned on and off responsive to the output signal from the lock indicator 44. This signal is applied to FETs 154, 156, 158, and 160. FETs 154 and 156 are PFETs and FETs 158 and 160 are NFETs. When the signal from the lock indicator indicates the PLL is in the unlocked condition the FETs 154, 156, 158, and 160 will turn on the FETs 150 and 152 thus supplying currents I1, I2, I3, and I4. When the signal from the lock indicator indicates a locked or operating condition the FETs 154, 156, 158, and 160 will turn off the FETS 150 and 152. Alternatively, the signal from the phase/frequency detector 10 could be used in conjunction with required circuitry to turn the FETs 150, and 152 on and off as shown in FIG. 1.

CHARGE PUMPS

Figure 14:
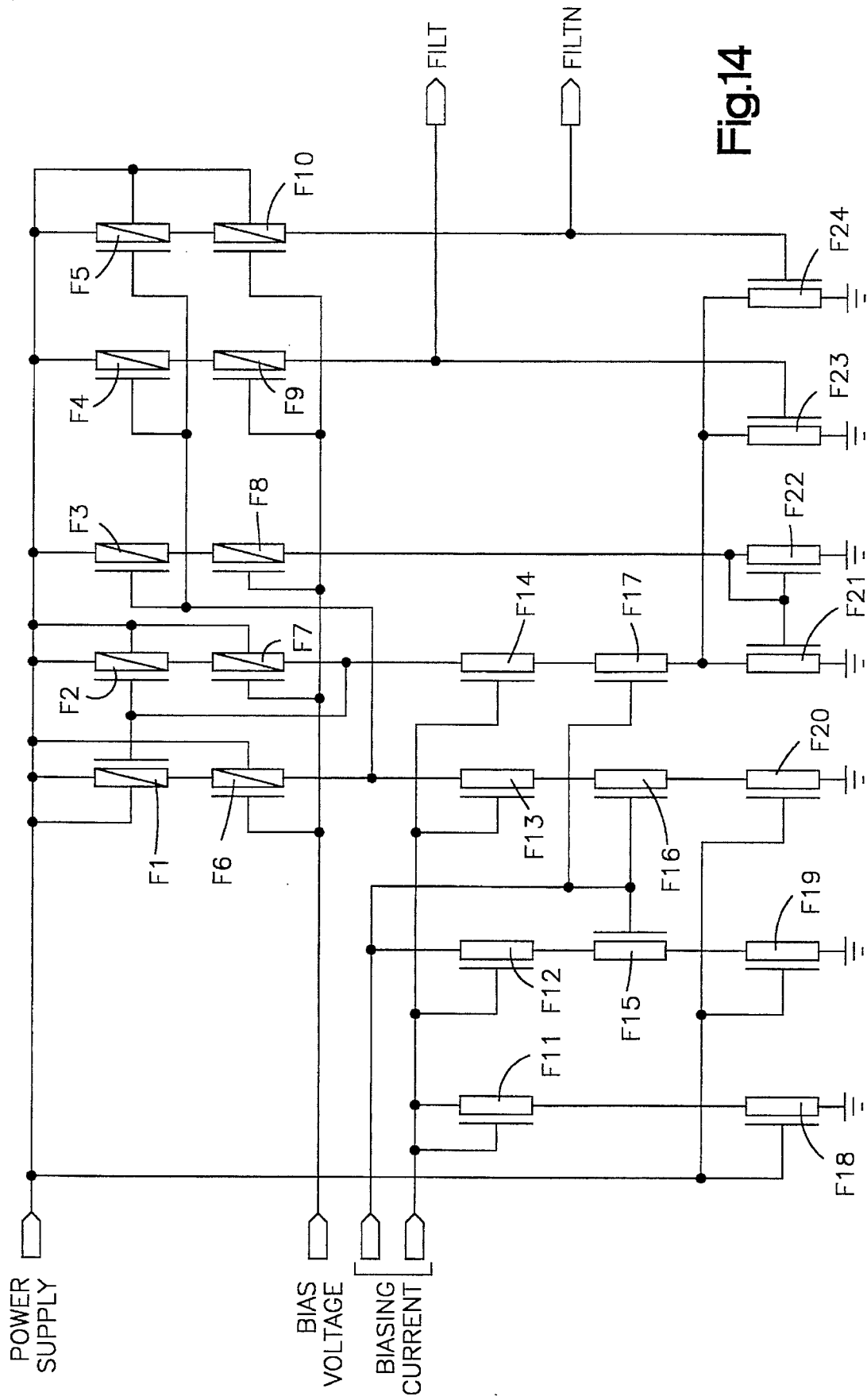
FIG. 14 is a circuit diagram of the common mode circuit of the charge pump of FIG. 12.

As indicated above the charge pumps 14 and 16 are used to control the loop filter capacitor 18 and the current controlled oscillator 20 respectively. The circuitry of the two pumps 14, 16 is different since the pump 14 is a differential output pump, and the pump 16 is a single-ended output pump. The charge pump circuitry translates digital correction pulses from the phase/frequency detector 10 into an analog control voltage and current to drive the current controlled oscillator 20. In terms of servo theory, it provides a "proportional plus integral" control function to minimize error while keeping the overall feedback loop stable. As can be seen in FIG. 13, correction signals arrive from the phase/frequency detector on inputs INC, INCN, DEC, and DECN. Fixed reference currents enter the circuit on lines I0, I1, I2 and I3. IPBIAS uses two of these currents to generate bias voltages for the two current switches, IPSWD and IPSWM. Block IPSWD, as commanded by the correction signals, injects pulses of current into a current-sensitive node of the oscillator 20 to provide the "proportional" portion of the feedback. Block IPSWM pulls current pulses from one or the other of the filter capacitors attached to FILT and FILTN; this is integrated by the capacitors into a differential voltage that represents the "integral" portion of the feedback. Block IPCM monitors the voltages in FILT and FILTN, and sources equal currents onto both nodes as required to hold their common-mode voltage constant. The circuitry for the pump 14 is shown in FIGS. 13A and 14.

Referring now to FIG. 13A, FETs 202, 204, 206 and 208 are connected as shown therein to gate the decrement (DEC) and decrement not (DECN) pulses, and FETs 210, 212, 214, and 216 connected to gate the increment (INC) and increment not (INCN) pulses from phase/frequency detector 10. FETs 204 and 208 are connected to ground through FET 218; and FETs 212 and 216 are connected to ground through FET 220. Bias 1 establishes voltage for FETS 202, 206, 210, 214. These devices constitute a cascode circuit to increase the output impedance of the charge pump. A second voltage bias, bias 2 establishes currents in the current sources in FETS 218 and 220.

The differential charge pump switch as shown in FIG. 13A pulls controlled pulses of current out of FILT or FILTN as commanded by the INC and DEC signals. Current sources FET 218 and FET 220 produce constant currents that are directed by differentials switch FETs 204, 208, 212, and 216 to either the positive supply or the FILT/FILTN nodes. Cascode devices FETs 202, 206, 210, 214 increase the output impedance of the pump outputs and reduce switching noise.

An INC pulse turns on FET 212 and an INCN pulse turns off FET 216, pulling current from FILTN and increasing the differential filter voltage. A DEC pulse turns on FET 204 and an DECN pulse turns off FET 208, pulling current from FILT and reducing the differential filter voltage.

When the DEC signal is high and the DECN signal is low from the detector 10 FET 204 is on and FET 208 is off and they will remain so as long as the DEC pulse is high. This will allow current from FET 218 to flow from the loop filter capacitor 18 to remove charge from the capacitor connected to node FILT. Conversely, when the INC signal is high and INCN signal is low, these will turn on FET 212 and turn off FET 216 which will drain current from the loop filter capacitor connected to node FILTN. The common mode circuit, shown in FIG. 14, maintains the common mode voltage on FILT and FILTN at about one-half the power supply voltage, and increases the range of operations of the pump 14. This common mode circuitry attaches to the outputs FILT and FILTN of the charge pump circuitry of FIG. 13A. Biasing voltage is provided for cascoded current mirrors. I1 and I0 provide biasing currents for cascoded PFET current mirrors. The use of this common mode circuit of FIG. 14 eliminates the need for clamping diodes on the output FILT and FILTN lines from the charge pump outputs shown in FIG. 13 and extends the linear range of the charge pump 14.

The common-mode feedback circuit as shown in FIG. 14 works to hold the common-mode voltage at the filter nodes constant. A reference current applied at input I1 flows through NFETs F12, F15 and F19, establishing a bias voltage on the gates of FETs F15–F17 such that FETs F19, F20, F23 and F24 are held in the linear operating region. Because of device matching, the current in FETs 13, 2, and 20 is equal to the I1 current. An equal reference current in I0 generates a bias voltage for cascode FETS F12, F13 and F14.

FETS F23 and F24 sense the voltage at nodes FILT and FILTN. These devices are sized so that the total current they pass will be equal to the current in FET F20 when the common-mode voltage is at the desired set point. The current from FET F23 and FET F24 is mirrored by PFETs F1, F2, F6 and F7. As the common-mode voltage decreases due to current being pulled from FILT or FILTN by the main charge pump, the current in FET F6 will decrease. Since the current in FET F13 remains constant, the voltage at the node between FET F6 and FET F13 decreases, turning on matched cascoded current sources FETS F4 and F9; and F5 and F10. These feed equal currents into FILT and FILTN, increasing the common-mode voltage without affecting the differential voltage. A secondary feedback path, FETS F3, F8, F22 and F21, reduces the loop gain to stabilize the circuit. Current from I0 is forced through transistors F11 and F18 which act to establish a voltage bias for FETs F12, F13 and F14.

Charge pump 16 supplies single ended output current to current controlled oscillator 20 responsive to differential pulses from phase/frequency detector 10. The circuitry for charge pump 16 is shown in FIG. 15. As can be seen in this Figure the differential input 16 is similar in structure to that of the charge pump 14, and includes FETS 230, 232, 234, and 236 configured to receive the INC and INCN signals and FETs 238, 240, 242, and 244 to receive the DEC and DECN signals from the phase/frequency detector 10. FETs 246 and 248 connect FETs 232 and 236 to ground and FETs 250 and 252 connect FETs 240 and 244 to ground. FETs 260 and 262 act as a first current mirror, FETs 264 and 266 act as a second current mirror and FETs 268 and 270 act as a third current mirror. FETs 272, 274, 276 and 278 connect FETs 230, 234, 238 and 242 to ground. FETs 280 and 282 are used to add charge at output IO which is the output current connected to current controlled oscillator 20, and FETs 284, 286 288 and 290 are used to reduce charge at output IO. Pulses on INC and INCN line from the phase/frequency detector 10 will turn on FET 232, and turn off FET 236, which will turn on FETs 280 and 282 which will cause current to flow to IO for a period of time corresponding to the width of the pulse thus adding current to the oscillator 20. Conversely, with a pulse on the DEC and DECN lines, FET 240 is turned on, and FET 244 is turned off, which turns on FETs 284, 286, 288, and 290 which connects IO to ground and thus there is a subtractive current to the current controlled oscillator 20 for a period of time corresponding to the width of the DEC pulse.

To recapitulate, the single-ended charge pump as shown in FIG. 15 injects bidirectional pulses of current into the oscillator 20 as commanded by the INC and DEC signals. Current sources FET 248, 246, 250 and 252 generate one of three different levels of current depending on the states of inputs VE0 and VE1. Current in the increment side of the pump passes through switch FET 232 and FET 236 to current mirror FETs 260 and 280, sourcing current to the oscillator 20. Current in the decrement side of the pump passes through switch FET 240, 244 to current mirror FET 264 and FET 268, and then through mirror FET 290, 286, sinking current from the current controlled oscillator. Constant currents from FET 274 and FET 278 are added to the current mirrors, improving response time while causing no net output current. Cascode devices FET 262, 266, 270, 282, 272, 230, 234, 276, 238, 242, 288, 284 improve response time and increase current source output impedance.

Hence charge pump 16 acts to either increase or decrease the current supplied to the oscillator 20 the output frequency of which is a function of the input current. As described previously, the charge pump 16 is used in place of a resistor in the filter loop 18, which use of a resistor is common prior art practice. Hence, the same result is achieved without the need of space-consuming resistors in the loop filter 18.

Current Controlled Oscillator

Figure 16:
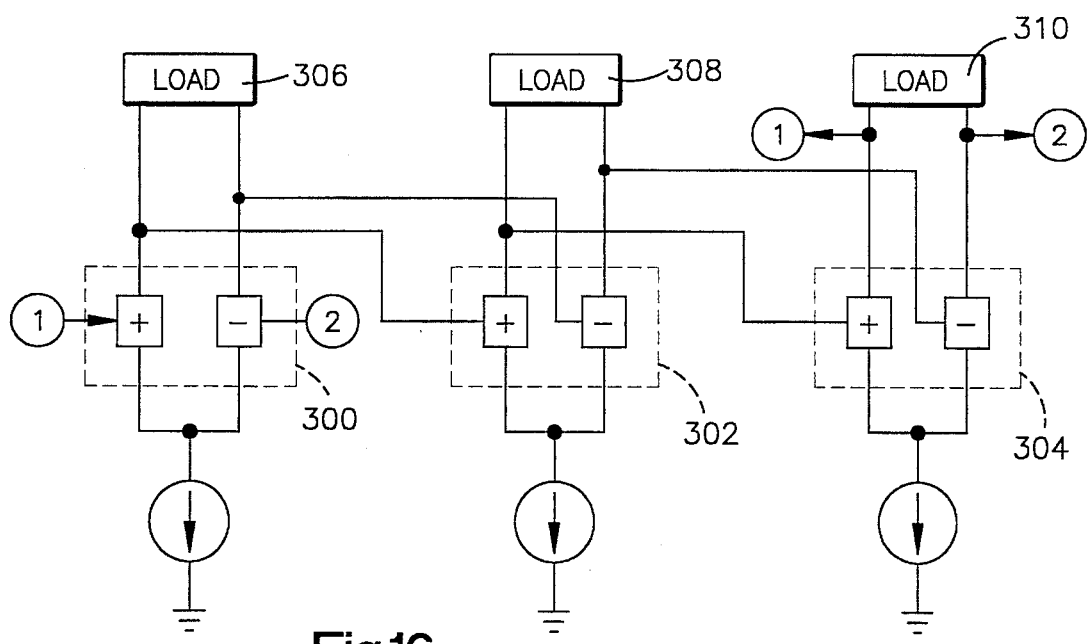
FIG. 16 is a high level block diagram of the current controlled oscillator of the PLL circuit.

The current controlled oscillator 20 outputs a differential signal, the frequency of which varies with the magnitude of the input current. The oscillator 20 uses FETs as the load elements, which thus allows the resistance to vary as the current varies. By varying the resistance with varying current, it is possible to maintain a relatively constant voltage across the differential pair loads and thereby extend the operating range of current controlled oscillation. This can be appreciated by reference to FIG. 16, which shows, at a high level, the general structure of a current controlled oscillator.

The oscillator 20 includes a series of differential pairs of FETs 300, 302 and 304, which constitute a ring oscillator. FET pairs 300, 302 and 304 each have a load 306, 308 and 310, respectively, thereacross. (Point 1 on FET pair 300 is connected to point 1 on FET pair 304, and point 2 on FET pair 300 is connected to point 2 on FET pair 304.) Current to the oscillator input I is supplied from voltage to current converter 22. It will be appreciated that the voltage drop across the differential pairs load varies as a function of value of current and value of the resistance of the loads 306, 308 and 310, i.e., according to the basic equation, V=IR. Thus, if the current I varies, and the resistance R remains the same, the output voltage will vary as a function of the current. This will narrow the operating range of the oscillator 20. However, if the resistance of the loads 306, 308 and 310 varies inversely with respect to the current, the voltage will remain essentially constant. While three stages of FET pairs 300, 302, 304, are shown and are used in the illustrated embodiment, a different number, e.g., four or more or even two stages could be used to form the ring oscillator. The circuit of the oscillator 20, including that which provides for variability of the resistance of loads 306, 308 and 310, is shown in FIG. 17.

Figure 17:
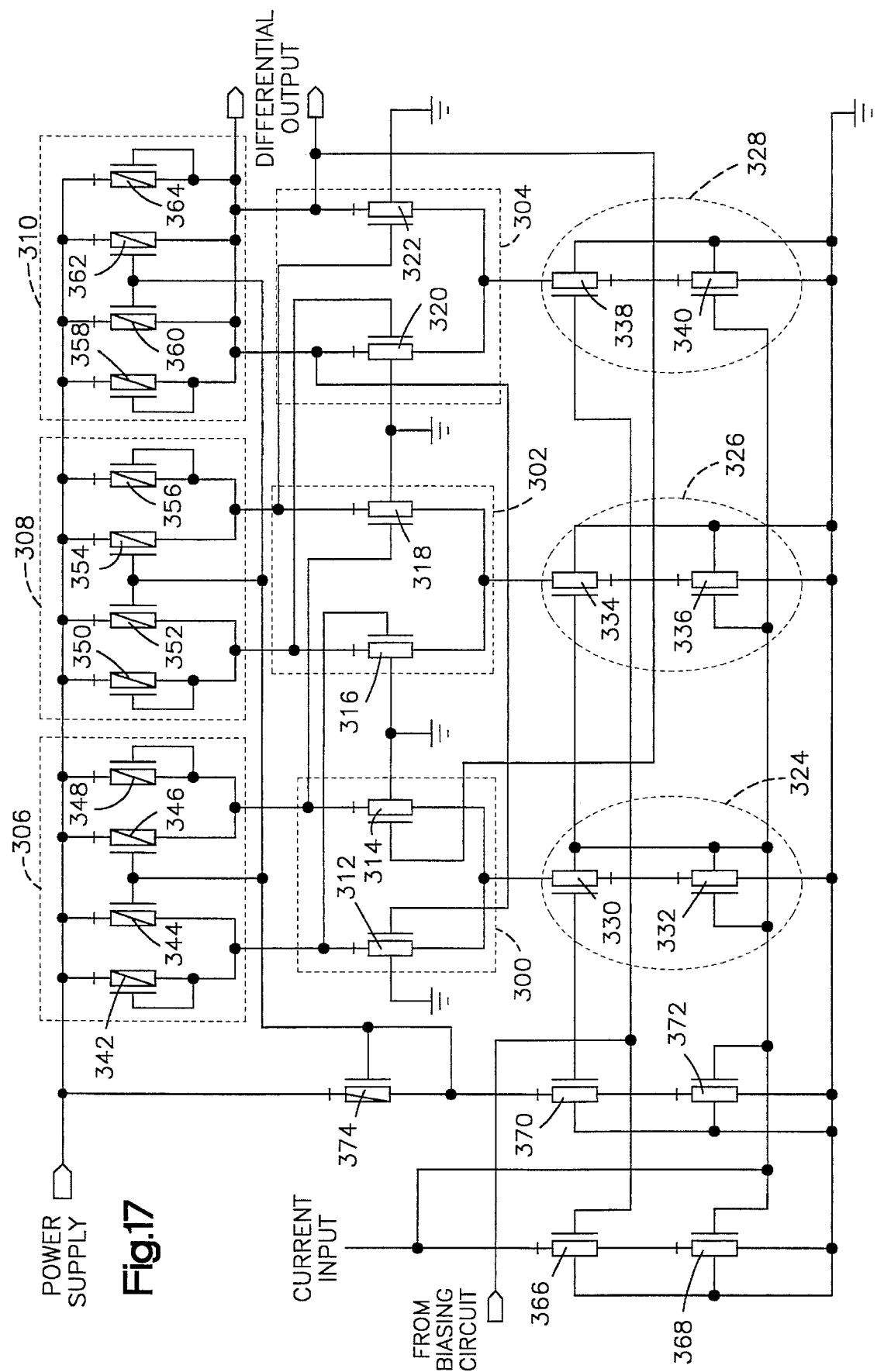
FIG. 17 is a circuit diagram showing the components of the current controlled oscillator.

As can be seen in FIG. 17, the three differential FET pairs 300, 302 and 304 each are comprised of a pair of FETs 312, 314; 316, 318; and 320, 322, respectively. In order to provide a stable current, three current sources 324, 326 and 328, are provided which are comprised of FET pairs 330, 332; 334, 336; and 338, 340, respectively, and connected in circuit relationship with the FETs of the three differential FET pairs 300, 302 and 304, respectively. The load 306 is comprised of FETs 342, 344, 346 and 348 connected to differential FET pair 300 as shown. Similarly, load 308 is comprised of FETs 350, 352, 354 and 356 connected to differential FET pair 302; and load 310 is comprised of FETs 358, 360, 362 and 364 connected to differential pair 304.

FETs 366, 368, 370, 372 and 374 are connected to the input current I/O from voltage to current converter 22, and the charge pump 16 as the current input. The current from the biasing circuit provides operating current for the FETs.

As indicated above, the differential pairs 300, 302 and 304 output a current, the frequency of which varies with variation in input current in a well-known manner. Moreover, the output voltage is maintained constant by varying the resistance of each of the loads 306, 308 and 310 inversely with respect to the current variation. This variation in the load resistance accomplishes this in the following way. Input current is forced into the cascoded first current mirror that consists of NFETS 366 and 368. The current is mirrored from the primary current mirror into the secondary current mirror that consists of NFETs 370 and 372. The second current mirror forces the current into the diode connected PFET 374. This PFET 374 provides the variable control voltage for the variable loads. When input current increases, the voltage drop across FET 334 increases and load resistance decreases. When input current decreases, the voltage across FET 374 decreases and load resistance increases. Each load is comprised of variable resistance PFETs 344, 348, 352, 356, 360, 362 and diode connected PFETs 342, 348, 350, 356, 358 and 364. Diode connected PFETs improve the load linearity and limit voltage swing across the load. The variable resistors changes resistance inversely proportional to the change in current and thus increases operational range of the oscillator 20.

Lock Indicator

The lock indicator 44 provides a signal indicating the PLL is in the phase locked condition. Such condition is necessary for the system designer to know or to be able to determine so that the circuits that need the output clock signal will operate only in the phase locked condition. Moreover, in detecting the locked condition it is necessary for the lock indicator not to be sensitive to timing, as well as correction pulses from the charge pumps 14, and 16. Additionally it is desirable that the lock indicator be input frequency independent, and not employ a timer since the locked characteristics may have different time values for different frequencies, and many prior art lock indicators are time dependent and do not account for different parameters at different frequencies.

The lock indicator 44 relies on the reference clock, and the output signals of the phase/frequency detector 10 to determine if the PLL is in its phase locked condition. Briefly, the lock indicator functions by generating a reset signal if the difference in the width of the increment pulses and the decrement pulses outputted from the phase/frequency detector 10 is greater than a given value v. The number of pulses from the reference clock are counted and if no output pulses from the phase/frequency detector 10 have a value greater than v for a given number n of input pulses e.g. sixteen of the reference clock, then the lock indicator 44 indicates the PLL is in the phase locked condition. Once in the locked condition, the lock indicator 44 will remain in the locked condition until a number of pulses having a value greater than v occur within a given number m of pulses of the reference clock. This number m is normally greater than the number n. When this happens the lock indicator 44 will give an output signal indicating the PLL is in the unlocked condition. The lock indicator will remain in the unlocked condition until no outputs having a width value greater than v occur during the given number of pulses n of the reference clock, at which time the lock indicator will again be driven to the locked condition. The output of the lock indicator 44 is latched in the locked or unlocked condition.

The circuitry for determining and latching the locked and unlocked condition is shown in FIG. 18. The reference clock signal is inputted to a delay circuit 380 which includes a pair of NAND gates 382, 384 connected to an XOR gate 386. The output of XOR gate 386 is inputted to a series of seven inverters 387 which output a signal to lock counter 388 and to unlock counter 390. The purpose of the delay circuit is to introduce a delay in the reference clock signal to match the delay caused by the phase/frequency detector 10 when generating the increment and decrement signals.

The lock counter 388, the structure of which will be described presently, counts 16 pulses and outputs a signal after 16 pulses, unless it is reset before reaching 16 pulses as will be described presently. The output from the lock counter 388 goes through a delay circuit 392 and is inputted to latch 394. An input pulse to the latch 394 from the lock counter latches the latch 394 to indicate the locked condition.

The increment and decrement signals from the phase/frequency detector 10 are inputted to XOR gate 398, the output of which is the difference in width of the INC and DEC pulses, and which output passes through a pair of inverters 400. The inverters 400 generate an output signal if and only if the difference in the widths of the increment and decrement pulses is greater than the given value v. The value of v depends on the values selected for the inverters 400; thus the amount of jitter tolerance can be designed into the circuit by selection of these values. The output of the inverters 400 is inputted to OR gate 402, the output of which is used to reset lock counter 388.

The output of lock counter 388 is also inputted to OR gate 404 the output of which is used to reset unlock counter 390. The unlock counter 390 counts 32 pulses, and if it has not been reset will generate an output pulse which will be gated through OR gate 406 to latch latch 394 in the unlocked condition.

The circuit operates in the following manner. When the reference clock inputs a signal, the signal passes through the delay circuit 380 and is impressed on both lock counter 388 and unlock counter 390. At this point the latch 394 is in the unlocked position. The lock counter 388 starts counting pulses and if it is not reset, at the end of 16 pulses it will generate an output signal to latch 394 in the locked position. At the same time that the reference clock is inputting a signal the phase/frequency detector 10 is inputting the increment INC and decrement DEC signals to XOR gate 398. If the difference in the width of these INC and DEC pulses is less than v, there will be no output from the inverters 400. If this no output condition exists for 16 pulses then the lock counter 388 is not reset and latch 394 is latched into the locked condition. If, however, at any time during the 16 pulse count by lock counter 388 a value of greater than v occurs between the width of the increment INC pulse and the decrement DEC pulse, the inverters 400 will output a signal to OR gate 402 which in turn will reset the lock counter 388 which will start its count again. The counting, and resetting of the lock counter 388 will continue until 16 pulses are counted without a reset signal from the inverters 400. At this time the latch 394 will enter the locked condition.

After the latch is in the locked condition, to get out of the locked to the unlocked condition, it is necessary that the increment and decrement pulses have a value greater than v over a period more than 16 pulses at which time the latch 394 will latch to the unlocked condition. This occurs as follows. It will be remembered that the output from the delay circuit 380 is also inputted to the unlock counter 390 which counts 32 pulses unless reset. After 32 pulses the unlock counter 390 outputs a signal to latch 394 in the unlocked condition. Assuming that the lock counter 388 has counted 16 pulses which produces an output signal, the output signal from the lock counter 388 is passed through OR gate 404 and resets unlock counter 390, which again starts to count to 32. Thus no output signal is generated by unlock counter 390, and thus the latch remains in the locked condition. Next, assume that a single pulse is generated by the inverters 400 indicating a width difference in the increment INC and decrement DEC pulses of more than v. When this happens the lock counter 388 is reset before reaching its 16 pulse count so there will be no reset signal delivered to the unlock counter and thus it will continue on its count of 32 pulses until it reaches the 32 count or is reset. Assuming there are no further pulses generated by the inverters, when the lock counter 388 reaches the count of 16 pulses it will output the signal which will reset unlock counter 390. Thus the latch 394 will remain in the locked condition. If, however, the signals generated by the inverters 400 extend for more than 16 clock pulses, the unlock counter 390 will not receive a reset signal before it reaches its 32 count and will thus generate a signal to the latch 394 to latch in the unlocked condition. This condition will continue until 16 pulses have been counted by the lock counter 388 which will then latch the latch 394 in the locked condition.

Thus it will be appreciated that the lock indicator of this circuit is relatively insensitive to clock jitter, since the PLL will be placed in the unlocked condition responsive only to differences in the width of the increment and decrement pulses of greater than a value v which value allows for some jitter which will not affect the locked condition. Moreover, the PLL will not go to the unlocked condition responsive to a few intermittent pulses of a value greater than v due to the need to replenish the charge on the loop filter capacitor 18 while the PLL is still in the locked mode. Also the lock indicator is responsive to input clock frequency and not time. Hence it is applicable over a wide range of frequencies with the same operating characteristics.

Referring now to FIG. 19, the structure of the lock counter 388 is shown. The circuit includes a series of five divide by 2 circuits 412 connected in series with four inverters 414. Divide by 2 circuits are well known in the art and any such conventional circuit can be used. Adding an additional divide by two circuit and inverter will give the structure of the 32 pulse count unlock counter 390.

It should be understood that the values of 16 pulse counts for the lock counter 388 and 32 pulse counts for the unlock counter 390 are somewhat arbitrary and may be varied depending on the various parameters of the PLL circuit. For example an 8 pulse counter might be sufficient to account for and accommodate extra charge pulses in some cases while in others 32 pulses for the lock counter 388 may be necessary. On the other hand a 64 pulse counter for the unlock counter 390 may be sufficient. Moreover the value of v can be adjusted or selected depending upon the jitter in the input signal by changing the device and sizes or values of inverters 400.

Although one embodiment of this invention has been shown and described, various adaptations and modifications can be made without departing from the scope of the invention as defined in the appended claims.

What is claimed is:

1. A differential charge pump for use in a phase locked loop circuit, and which pump is powered by a power supply, comprising, a pulse generating circuit connected to receive increment and decrement pulses from a pulse generating source and to output said increment and decrement pulses as a differential output voltage at a differential output;

a common mode circuit having a gain, in circuit connection with said differential output for regulating a common mode voltage on said differential output without changing the differential output voltage at said differential output;

said common mode circuit comprising a feedback loop circuit for controlling the gain of said common mode circuit; said feedback loop circuit comprising:

a cascode current source circuit for supplying current based on said differential output voltage.

2. The charge pump as defined in claim 1, wherein said cascode current source circuit includes field effect transistors.

3. The charge pump as defined in claim 1, wherein said common mode voltage is maintained at about one-half the voltage of the power supply.

4. A phase locked loop circuit comprising:

a. a power supply node for supplying a power supply voltage to said phase locked loop circuit;

b. a filter circuit for storing a differential voltage; said filter circuit having a plurality of filter circuit inputs;

c. a differential charge pump in circuit communication with said plurality of filter circuit inputs and said power supply node, said differential charge pump having an output for providing a differential charge to said plurality of filter circuit inputs;

d. a single ended charge pump in circuit communication with an oscillator circuit and said power supply node, for providing an input to said oscillator;

e. a common mode circuit in circuit communication with said filter circuit and said power supply node, for regulating a common mode voltage at said filter circuit inputs; said common mode circuit comprising a feedback loop circuit having a cascode current source circuit for supplying current based on said differential charge; and f. a phase/frequency detector in circuit communication with said differential charge pump and said single ended charge pump.

5. The phase locked loop circuit of claim 4 wherein said filter circuit comprises capacitors.

6. The phased locked loop circuit of claim 4 wherein said common mode voltage is maintained at half the power supply voltage.

7. In a phase locked loop circuit having a filter circuit for storing a differential voltage and a power supply node for supplying a power supply voltage, a common mode circuit comprising:

a. differential voltage input nodes for receiving the differential voltage;
b. a sensing circuit in circuit communication with said differential voltage input nodes, for sensing the differential voltage on said differential voltage input nodes;
c. a sourcing circuit in circuit communication with said differential voltage input nodes, for supplying charge to said filter circuit by said differential voltage input nodes; and
d. a feedback loop circuit in circuit communication with said differential voltage input nodes, for controlling the amount of charge supplied to said differential voltage input nodes; said feedback loop circuit comprising:
   (1) a cascode current source circuit for supplying current based on said differential voltage input nodes voltage level.

* * * * *

UNITED STATES PATENT AND TRADEMARK OFFICE
CERTIFICATE OF CORRECTION

PATENT NO. : 5,619,161
DATED      : April 8, 1997
INVENTOR(S) : Ilya I. Novof and Donald E. Strayer It is certified that error appears in the above-identified patent and that said Letters Patent is hereby corrected as shown below:

On title page, item [54] and on Column 1, Line 1, change "DIFFRENTIAL" to "DIFFERENTIAL".

Signed and Sealed this

Seventh Day of October, 1997

Attest:

BRUCE LEHMAN

Attesting Officer

Commissioner of Patents and Trademarks